US010747281B1

(12) United States Patent
Trim et al.

(10) Patent No.: US 10,747,281 B1
(45) Date of Patent: Aug. 18, 2020

(54) MOBILE THERMAL BALANCING OF DATA CENTERS

(71) Applicant: International Business Machines Corporation, Armonk, NY (US)

(72) Inventors: Craig M. Trim, Ventura, CA (US); Jeremy R. Fox, Georgetown, TX (US); Shikhar Kwatra, Durham, NC (US); Sarbajit K. Rakshit, Kolkata (IN)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 16/687,842

(22) Filed: Nov. 19, 2019

(51) Int. Cl.
*G06F 1/20* (2006.01)
*H04N 7/18* (2006.01)
*H04N 5/33* (2006.01)
*H05K 7/20* (2006.01)

(52) U.S. Cl.
CPC .............. *G06F 1/206* (2013.01); *H04N 5/33* (2013.01); *H04N 7/18* (2013.01); *H05K 7/20836* (2013.01)

(58) Field of Classification Search
None
See application file for complete search history.

(56) References Cited

U.S. PATENT DOCUMENTS

| 7,644,051 | B1 * | 1/2010 | Moore | G05B 13/027 |
| | | | | 706/21 |
| 9,451,731 | B2 | 9/2016 | Rasmussen et al. | |
| 9,826,656 | B2 | 11/2017 | Connor et al. | |
| 9,939,796 | B2 | 4/2018 | Dawson et al. | |
| 2006/0242186 | A1 | 10/2006 | Hurley | |
| 2007/0089446 | A1 * | 4/2007 | Larson | G06F 1/206 |
| | | | | 62/259.2 |
| 2009/0019201 | A1 * | 1/2009 | Chainer | H04L 41/12 |
| | | | | 710/107 |
| 2010/0010688 | A1 * | 1/2010 | Hunter | G06F 1/206 |
| | | | | 700/300 |
| 2010/0138530 | A1 * | 6/2010 | Brillhart | G06F 1/206 |
| | | | | 709/224 |
| 2010/0138682 | A1 * | 6/2010 | Obana | G06F 1/206 |
| | | | | 713/340 |
| 2010/0142544 | A1 | 6/2010 | Chapel et al. | |

(Continued)

OTHER PUBLICATIONS

Kleyman, Bill, "The Role of Robotics in Data Center Automation", Dec. 18, 2013, DataCenter Knowledge, 7 pages, <https://www.datacenterknowledge.com/archives/2013/12/18/role-robotics-data-center-automation>.

(Continued)

*Primary Examiner* — Ryan A Jarrett
(74) *Attorney, Agent, or Firm* — William H. Hartwell

(57) ABSTRACT

A tool for mobile thermal load balancing in a data center. The tool determines a heat signature pattern for one or more data center units based on a plurality of heat signatures over a pre-determined time period. The tool determines a high heat signature zone within a confined region of the data center based, at least in part, on a current arrangement of the one or more data center units. Responsive to a determination that a high heat signature zone within the data center exceeds a predetermined heat threshold, the tool rearranges the one or more data center units within the high heat signature zone to a region within the data center that balances a thermal load associated with the high heat signature zone across the data center.

20 Claims, 4 Drawing Sheets

(56) References Cited

U.S. PATENT DOCUMENTS

| | | | |
|---|---|---|---|
| 2010/0217454 A1* | 8/2010 | Spiers | G05D 23/1932 |
| | | | 700/300 |
| 2011/0243409 A1 | 10/2011 | Naimi et al. | |
| 2014/0052429 A1 | 2/2014 | Kelkar et al. | |
| 2015/0032283 A1* | 1/2015 | Kelkar | H05K 7/20745 |
| | | | 700/300 |
| 2015/0123562 A1* | 5/2015 | Adriaenssens | H05B 47/105 |
| | | | 315/291 |
| 2018/0025299 A1* | 1/2018 | Kumar | G06F 9/4881 |
| | | | 709/224 |
| 2018/0107183 A1 | 4/2018 | Dawson et al. | |
| 2019/0069433 A1* | 2/2019 | Balle | G06F 11/00 |
| 2019/0309968 A1* | 10/2019 | Nalajala | F24F 11/523 |

OTHER PUBLICATIONS

Pearce, Fred, "Energy Hogs: Can World's Huge Data Centers Be Made More Efficient?", Yale Environment 360, Published at the Yale School of Forestry & Environmental Studies, Apr. 3, 2018, 8 pages. <https://e360.yale.edu/features/energy-hogs-can-huge-data-centers-be-made-more-efficient>.

Statista Research Department, Number of data centers worldwide in 2015, 2017, and 2021 (in millions), Last edited Feb. 25, 2019, 2 pages, <https://www/sstatista.com/statistics/500458/worldwide-datacenter-and-it-sites/>.

Statista Research Department, "Size of the multi-tenant data center market by segment worldwide from 2013-20121 (in million U.S. dollars)", Last Edited Aug. 27, 2018, 2 pages, <https://www/statista.com/statistics/901453/multi-tenant-data-center-market-by-segment-worldwide/>.

* cited by examiner

MOBILE THERMAL BALANCING OF DATA CENTERS

BACKGROUND OF THE INVENTION

The present invention relates generally to data center management, and more particularly to mobile thermal balancing of data centers.

The global importance and criticality of data centers cannot be understated. Although actual numbers of total new data centers globally may be in decline, there is an increase in larger data centers that house more total cumulative data for servicing public, private, and hybrid cloud data for various usages. These larger data centers consume vast amounts of electricity, and emit considerable amounts of heat. As data centers are growing in physical size, the thermal heat produced by larger data centers increases proportionally to the increase in size of the data center.

SUMMARY

Aspects of an embodiment of the present invention disclose a method, a computer system and a computer program product for mobile thermal load balancing in a data center. The method includes determining, by one or more computer processors, a heat signature pattern for one or more data center units based on a plurality of heat signatures over a pre-determined time period. The method includes determining, by the one or more computer processors, a high heat signature zone within a confined region of the data center based, at least in part, on a current arrangement of the one or more data center units, wherein determining the high heat signature zone includes utilizing one or more thermal cameras and computer vision to monitor the heat signature pattern for one or more data center units for a deviation from a normal heat distribution for the data center. Responsive to a determination that a high heat signature zone within the data center exceeds a predetermined heat threshold, the method includes rearranging, by the one or more computer processors, the one or more data center units within the high heat signature zone to a region within the data center that balances a thermal load associated with the high heat signature zone across the data center.

DETAILED DESCRIPTION

Embodiments of the present invention recognize that there exists an underlying problem in data centers where there are a large multitude of servers to be stored in a cool and dry environment. Vast amounts of heat are generated by highly computationally intensive server racks juxtaposed with one another, which can be hazardous in an enclosed data center, potentially leading to system damage. Embodiments of the present invention recognize that server racks stored close to each other can have highly elevated temperatures beyond certain heat tolerances.

Embodiments of the present invention provide the capability to rearrange server racks in a data center based on a predicting heat signatures before the heat signatures for the server racks reach hazardous levels.

Implementation of such embodiments may take a variety of forms, and exemplary implementation details are discussed subsequently with reference to the Figures.

Figure 1:
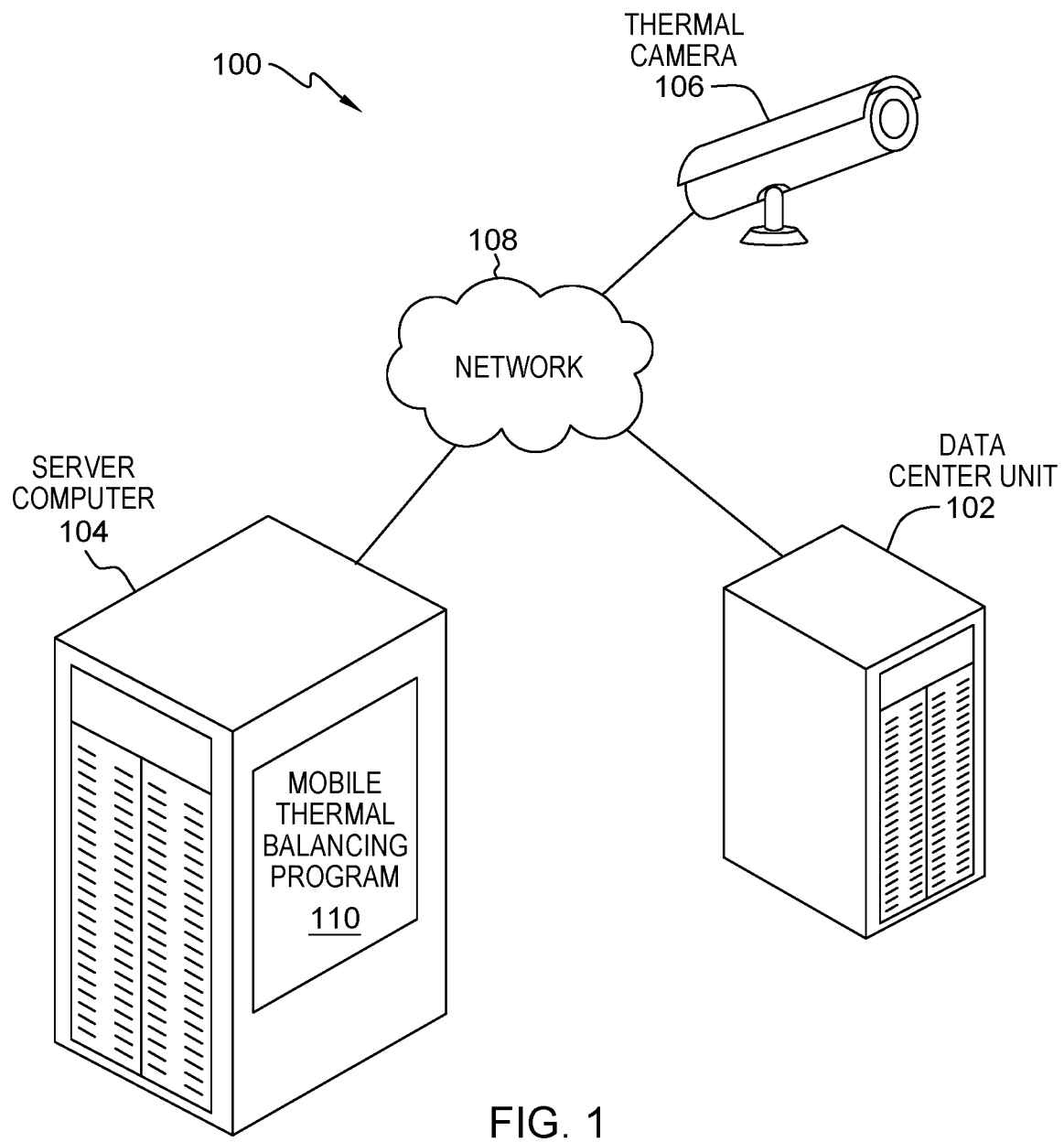
FIG. 1 is a functional block diagram illustrating a data center management environment suitable for operation of a mobile thermal balancing program, in accordance with an embodiment of the present invention.

Referring now to various embodiments of the invention in more detail, FIG. 1 is a functional block diagram that illustrates a portion of a data center management environment, generally designated 100, suitable for operation of a mobile thermal balancing program in accordance with at least one embodiment of the invention. In one embodiment, data center management environment 100 includes a plurality of data center units, such as data center unit 102. In one embodiment, the plurality of data center units, such as data center unit 102, can be interconnected to form one or more data libraries. The one or more data libraries can be organized into a plurality of columns evenly spaced within a floor space (i.e., within a designated space within, for example, a building, a warehouse, etc.). In another embodiment, one or more data center units, such as data center unit 102, may be stacked atop the one or more data libraries organized into the plurality of columns to satisfy demands imposed by future growth of data center management, within existing floor space, by effectively building up, as opposed to building out. FIG. 1 provides only an illustration of one implementation and does not imply any limitations with regard to the environments in which different embodiments may be implemented. Many modifications to the depicted environment may be made by those skilled in the art without departing from the scope of the invention as recited by the claims.

In one embodiment, data center management environment 100 includes data center unit 102 and server computer 104, and thermal camera 106 interconnected over network 108. Network 108 can be, for example, a telecommunications network, a local area network (LAN), a wide area network (WAN), such as the Internet, or a combination of the three, and can include wired, wireless, or fiber optic connections. Network 108 may include one or more wired and/or wireless networks that are capable of receiving and transmitting data, voice, and/or video signals, including multimedia signals that include voice, data, and video and thermal information. In general, network 108 may be any combination of connections and protocols that will support communications between data center unit 102 and server computer 104, as well as other computing devices (not shown) within data center management environment 100. FIG. 1 is intended as an example and not as an architectural limitation for the different embodiments.

In one embodiment, data center unit 102 may be any computer system and associated components stored within a dedicated space within a building or group of buildings (i.e., a data center). In one embodiment, data center unit 102 may represent a server rack, a physical tape library, a telecommunications device or networking hardware. In one embodiment, data center unit 102 may represent any computer system for servicing public, private, and hybrid cloud data for various usages. In one embodiment, data center unit 102 may represent a collection of data center server systems or server racks stored within a data center. In one embodiment, data center unit 102 may be represent a multitude of server racks organized in partitions or rows within a data center.

In one embodiment, server computer 104 can be a stand-alone computing device, a management server, a web server, a mobile computing device, or any other electronic device or computing system capable of receiving, sending, and processing data. In other embodiments, server computer 104 can represent a server computing system utilizing multiple computers as a server system, such as in a cloud computing environment. In an embodiment, server computer 104 represents a computing system utilizing clustered computers and components (e.g., database server computers, application server computers, etc.) that act as a single pool of seamless resources when accessed within data center management environment 100. Server computer 104 includes mobile thermal balancing program 110 communicatively coupled to server computer 104. Server computer 104 may include internal and external hardware components, as depicted and described in further detail with respect to FIG. 4.

In one embodiment, mobile thermal balancing program 110 operates on a central server, such as server computer 104 and may be utilized by one or more mobile modules (not shown), via network 108. In another embodiment, mobile thermal balancing program 110 may be a program downloaded from the central server or a third-party provider (not shown), and executed to rearrange one or more server racks, such as data center unit 102, in a data center based on understanding and predicting heat signatures in the data center. In yet another embodiment, mobile thermal balancing program 110 may be utilized as a software service provided by a third-party cloud service provider (not shown). In yet another embodiment, mobile thermal balancing program 110 may include one or more components, such as add-ons, plug-ins, and agent programs, etc., installed on one or more smart devices, such as thermal camera 106 and one or more robotic bots (not shown), to provide a robotic portable mobile enhancement below one or more server racks, such as data center unit 102, capable of detecting, monitoring, and predicting heat signatures for the one or more server racks, and moving the one or more server racks in order to balance the thermal heat distribution within a data center.

In one embodiment, mobile thermal balancing program 110 is a program for providing the capability to detect and communicate with one or more camera systems, such as forward looking infrared (FLIR), in the vicinity of one or more server racks, and utilizing the one or more camera systems and machine learning techniques, monitor and predict head signatures of the one or more server racks to determine an optimal physical rearrangement to balance thermal heat distribution within a data center. In one embodiment, mobile thermal balancing program 110 provides a cognitive system that determines heat signature patterns and damaging heat thresholds for one or more server racks within a data center based on large datasets, hardware and device based information, and crowd-sourcing. In one embodiment, mobile thermal balancing program 110 provides the capability to predict future heat signatures that may lead to a critical level of heat for one or more data center units, such as data center unit 102, by monitoring a plurality of sensors in real-time, such as thermal camera 106. In one embodiment, mobile thermal balancing program 110 provides a robotic system that includes self-moving modules capable of moving one or more server racks to provide effective cooling of appropriate data center units, such as data center unit 102. In one embodiment, mobile thermal balancing program 110 provides a mechanism for identifying one or more server racks, such as data center unit 102, that may require immediate or proactive cooling based on observed or predicted workload demands. In one embodiment, mobile thermal balancing program 110 provides the capability to predict and identify cold areas or locations within a data center, and mobilize robotic modules to rearrange one or more server racks to the cold areas in the data center to balance thermal heat distribution and improve longevity of the one or more server racks.

In one embodiment, thermal camera 106 is a video camera capable of thermal imaging and interconnected with a server, such as server computer 104, via a network, such as network 108. In another embodiment, thermal camera 106 is smart device capable of pairing with a server computer, such as server computer 104, and communicating a program on a server, such as mobile thermal balancing program 110 on server computer 104. In one embodiment, thermal camera 106 provides the capability to detect FLIR signals and provide images or video frame samples of areas within a data center producing high heat signatures.

Figure 2:
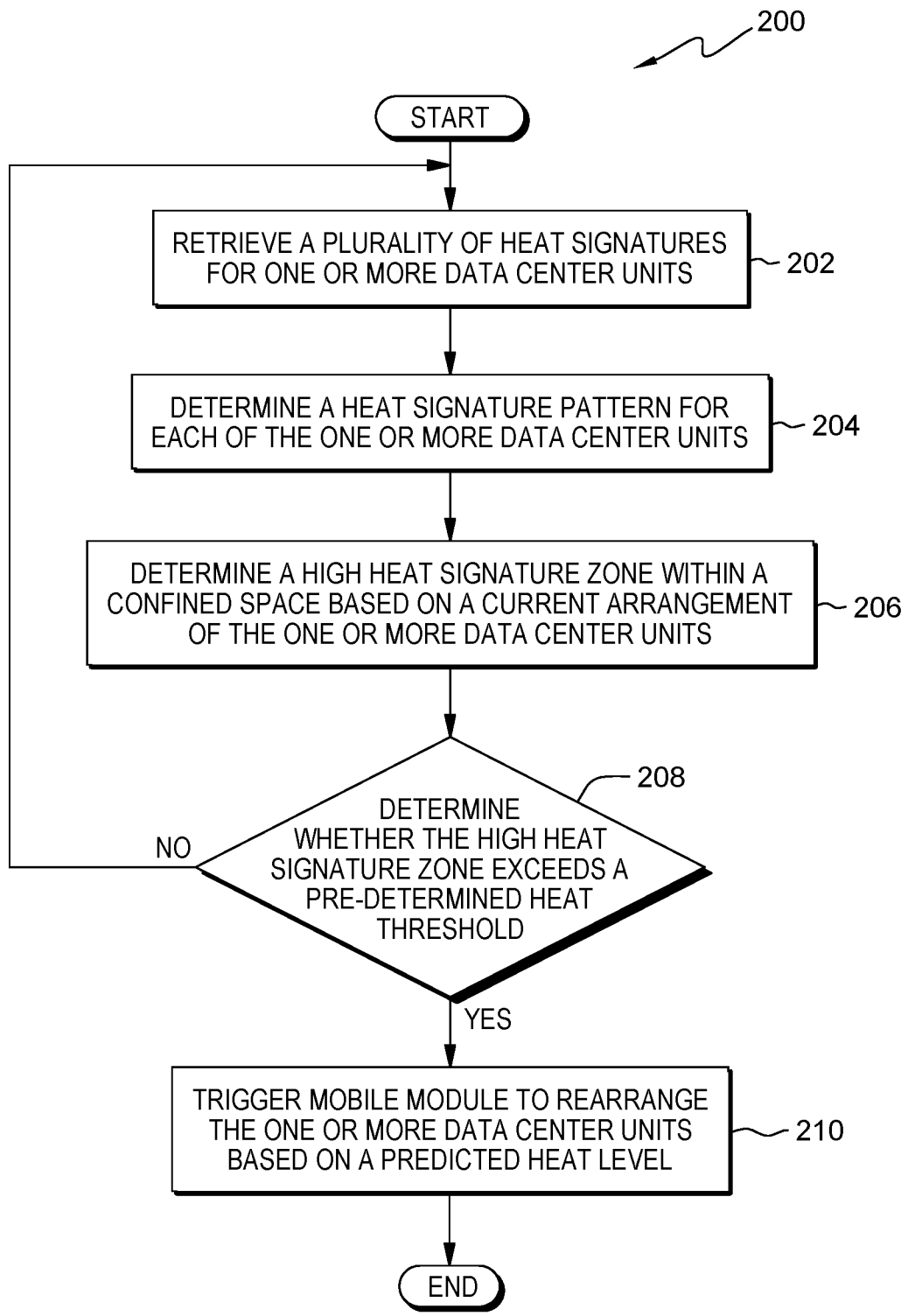
FIG. 2 is a flowchart depicting operational steps of a mobile thermal balancing program, in accordance with an embodiment of the present invention.

FIG. 2 depicts a flowchart of operational steps of a mobile thermal balancing program, such as mobile thermal balancing program 110 of FIG. 1, generally designated 200, for proactive heat generating server rack rearrangement within a data center, in accordance with an embodiment of the present invention.

Mobile thermal balancing program 110 retrieves a plurality of heat signatures for one or more data center units (202). In one embodiment, mobile thermal balancing program 110 retrieves a plurality of heat signatures for one or more data center units, such as data center unit 102, by detecting and communicating with one or more thermal cameras, such as thermal camera 106, in the vicinity of the one or more data center units. In one embodiment, mobile thermal balancing program monitors and retrieves video frame output, such as FLIR heat signatures over a video sample, from one or more thermal imaging cameras, such as thermal camera 106, trained (i.e., aimed and focused) on one or more data center units, such as data center unit 102, within a confined region of a data center. In one embodiment, mobile thermal balancing program 110 monitors and retrieves video frame output from one or more thermal imaging cameras over a pre-determined time period (e.g., minutes, hours, days, weeks, or months, etc.), or during one or more pre-determined events (e.g., periods of intense workload demand, periods of stand-by, etc.).

Mobile thermal balancing program 110 determines a heat signature pattern for each of the one or more data center units (204). In one embodiment, mobile thermal balancing program 110 determines a heat signature pattern for each of the one or more data center units utilizing the retrieved plurality of heat signatures. In one embodiment, mobile thermal balancing program 110 determines a heat signature pattern for each of the one or more data center units, such as data center unit 102, by using computer vision, such as regional convolutional neural network (R-CNN), to analyze temporal data for heat signature fluctuations of the one or more data center units, and latitudinal and longitudinal coordinates in a vectored form to predict probabilistic heat signatures over a pre-determined period of time.

In an alternative embodiment, mobile thermal balancing program 110 determines a heat signature pattern for each of the one or more data center units utilizing a crowd-sourced corpus of knowledge. In one embodiment, mobile thermal balancing program 110 may employ an artificial intelligence based system to leverage hardware and device information for the one or more data center units, such as data center unit 102, through crowd-sourcing to populate a database (i.e., corpus of knowledge) with mathematically expected heat response situations. In one embodiment, mobile thermal balancing program 110 may utilize the corpus of knowledge to determine derivations from a standard mean (i.e., average) set by the expected heat response situations for heating and cooling context provided within situational context. In one embodiment, mobile thermal balancing program 110 may monitor heat based reactions for one or more data center units, such as data center unit 102, considering both time and date of the reactions, and specific details of the one or more data center units (e.g., type of servers, type of server racks, location of server racks, etc.). In one embodiment, mobile thermal balancing program 110 determines a heat signature baseline reaction to a specific situation encountered by one or more data center units, and derives a standard distribution of heat signatures and heat signature patterns for the one or more data center units.

Mobile thermal balancing program 110 determines a high heat signature zone within a confined region based on a current arrangement of the one or more data center units (206). In one embodiment, mobile thermal balancing program 110 determines a high heat signature zone within a confined region based on a current arrangement of the one or more data center units by predicting a workload demand that would likely impact (e.g., increase) the heat signatures for the one or more data center units. In another embodiment, mobile thermal balancing program 110 may determine a high heat signature zone based on retrieving a heat signature for each of the one or more data center units, from a thermal camera video image, that deviates from a standard heat response expected for the one or more data center units given a specific situation. In another embodiment, mobile thermal balancing program 110 determines a high heat signature zone within a confined region based on a location of the heat signature patterns and the heat signatures of the one or more data centers within the confined region that deviates from a normal heat distribution for the data center. In another embodiment, mobile thermal balancing program 110 detects a high heat signature zone utilizing a screen capture from a FLIR camera, such as thermal camera 106, that indicates a region within the data center that deviates from a normal thermal heat distribution.

Mobile thermal balancing program 110 determines whether the high heat signature zone exceeds a pre-determined heat threshold (decision block, 208). In one embodiment, mobile thermal balancing program 110 determines whether the high heat signature zone exceeds a pre-determined heat threshold by comparing the heat signatures of the one or more data centers units within the high heat signature zone to expected (i.e., predicted) heat signatures for the one or more data center units. In one embodiment, mobile thermal balancing program 110 configures the pre-determined heat threshold based on a machine learning system that considers server rack failure and server rack fault tolerances occurring at certain high temperatures. In another embodiment, mobile thermal balancing program 110 configures the pre-determined heat threshold automatically based, at least in part, on a type of data center unit, a size of a data center, and a predicted heat reaction for a data center unit responsive to various situational workload demands. Where mobile thermal balancing program 110 determines that the heat signatures of the one or more data centers units within the high heat signature zone deviate above the expected heat signatures for the one or more data center units, mobile thermal balancing program 110 determines that the pre-determined heat threshold has been exceeded. Where mobile thermal balancing program 110 determines that the heat signatures of the one or more data centers units within the high heat signature zone are within or below the expected heat signatures for the one or more data center units, mobile thermal balancing program 110 determines that the pre-determined heat threshold has not been exceeded.

Responsive to a determination that the pre-determined heat threshold has not been exceeded (NO branch, 208), mobile thermal balancing program 110 continues to cycle through the preceding steps, beginning with retrieving a plurality of heat signatures for the one or more data center units (202).

Responsive to a determination that the pre-determined heat threshold has been exceeded (YES branch, 208), mobile thermal balancing program 110 triggers a mobile module to rearrange the one or more data center units based on a predicted heat level (210). In one embodiment, mobile thermal balancing program 110 triggers a mobile module (e.g., robotic bots, robotic system, etc.) to rearrange the one or more data center units based on a predicted heat level of the one or more data centers in a rearranged configuration within a data center. In one embodiment, mobile thermal balancing program 110 triggers the mobile module automatically based on learning system failures and data center unit fault tolerances occurring over high temperature thresholds. In one embodiment, mobile thermal balancing program 110 selects a region within the data center utilizing predictive analytics, or direct thermal observation via a thermal camera, to provide a desired cooling effect on one or more data center units, and directs the triggered mobile module to rearrange the one or more data center units exhibiting a high heat signature to the selected region.

In an alternative embodiment, mobile thermal balancing program 110 my employ machine learning techniques on historical sensor feeds, thermal camera feeds from a data center related to air flow, temperature of air in various spaces of the data center, and contextual situation data, including heat generation in the one or more data center units, processing of data in the one or more data center units, and workload demand on the one or more data center units, etc. In this embodiment, mobile thermal balancing program 110 creates a corpus of knowledge by correlating an air flow direction within the data center, a temperature of air within the data center, a relative position of the one or more data center units generating heat, and an amount of heat generated by the one or more data center units, etc. In this embodiment, mobile thermal balancing program 110 predicts a relative position for the one or more data center units, based on the created corpus of knowledge, for any contextual situation, that provides a desired cooling effect and thermal load balancing, and accordingly directs a robotic system to reposition the one or more data center units within the data center to the predicted location to ensure optimal temperatures are balanced and maintained across the data center.

Figure 3:
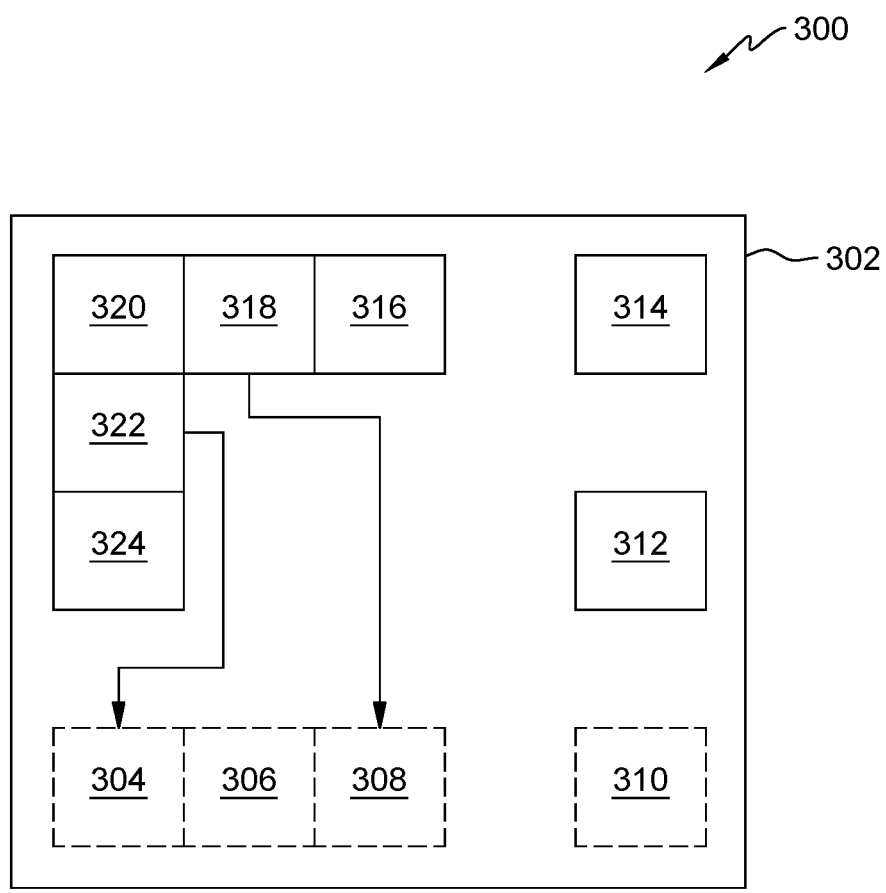
FIG. 3 is a configuration diagram illustrating a configuration of a plurality of data center units in a confined region of a data center management environment, in accordance with an embodiment of the present invention.

FIG. 3 is a configuration diagram, generally designated 300, illustrating a configuration of a plurality of data center units in a confined region of a data center management environment 100, in accordance with an embodiment of the present invention.

In one embodiment, the plurality of data center units, including, but not limited to data center unit 310, 312, 314, 316, 318, 320, 322, and 324, are arranged within a confined region of a data center management environment 100, such as confined region 302. In one embodiment, a plurality of open locations, such as open location 304, 306, and 308 may be present within a confined region of a data center management environment 100, such as confined region 302. Open location 304, 306, and 308 illustrate open floor space in a confined region of a data center management environment 100, such as confined region 302. In one embodiment, open location 304, 306, and 308 are locations within confined region 302 that are predicted to be the coldest, and therefore capable of providing the greatest impact on thermal load balancing within the confined region. In one embodiment, open locations, such as open location 304, 306, and 308 may any location with a confined region, such as confined region 302, where a data center unit, such as data unit 318 and 322 may be moved to utilizing an autonomous mobile module (e.g., mobile bot, robotic device, etc.) to cool down the data center unit and balance cumulative thermal load over the confined region. In one embodiment, moving data center units, such as data center unit 318 and 322, via an autonomous mobile module (not shown), to a predicted cold open location, such as open location 304 and 308, allows for data center unit rearrangement to balance thermal load of the data center units over the confined region, providing the greatest overall thermal cooling and thereby protecting data center units, such as data center units 310, 312, 314, 316, 318, 320, 322, and 324 from potential thermal related failure occurring over high temperature heat thresholds. In one embodiment, where a predicted cold location is currently occupied by a data center unit, mobile thermal balancing program 110 may rearrange the data center unit, moving it to a potentially warmer location within the data center, in order to open up the predicted cold location for a data center unit requiring immediate or proactive cooling.

Figure 4:
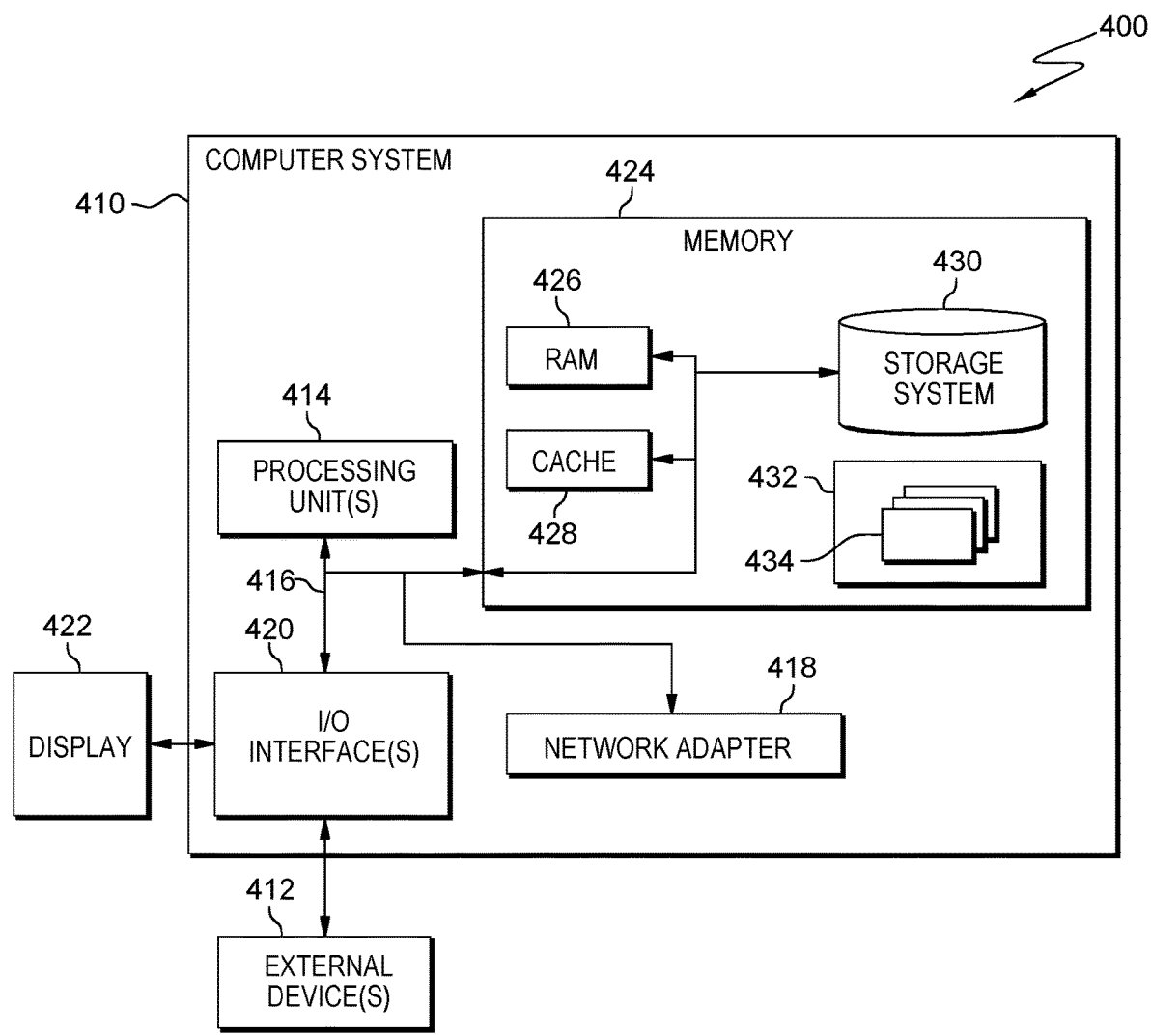
FIG. 4 is a block diagram depicting components of a data processing system (e.g., server computer of FIG. 1), in accordance with an embodiment of the present invention.

FIG. 4 depicts a block diagram of components of data processing system, such as server computer 104 of FIG. 1, generally designated 400, in accordance with an illustrative embodiment of the present invention. It should be appreciated that FIG. 4 provides only an illustration of one implementation and does not imply any limitations with regard to the environments in that different embodiments may be implemented. Many modifications to the depicted environment may be made.

In the illustrative embodiment, server computer 104 in data center management environment 100 is shown in the form of a general-purpose computing device, such as computer system 410. The components of computer system 410 may include, but are not limited to, one or more processors or processing unit(s) 414, memory 424 and bus 416 that couples various system components including memory 424 to processing unit(s) 414.

Bus 416 represents one or more of any of several types of bus structures, including a memory bus or memory controller, a peripheral bus, an accelerated graphics port and a processor or local bus using any of a variety of bus architectures. By way of example, and not limitation, such architectures include Industry Standard Architecture (ISA) bus, Micro Channel Architecture (MCA) bus, Enhanced ISA (EISA) bus, Video Electronics Standards Association (VESA) local bus and Peripheral Component Interconnect (PCI) bus.

Computer system 410 typically includes a variety of computer system readable media. Such media may be any available media that is accessible by computer system 410 and it includes both volatile and non-volatile media, removable and non-removable media.

Memory 424 can include computer system readable media in the form of volatile memory, such as random access memory (RAM) 426 and/or cache memory 428. Computer system 410 may further include other removable/non-removable, volatile/non-volatile computer system storage media. By way of example only, storage system 430 can be provided for reading from and writing to a non-removable, non-volatile magnetic media (not shown and typically called a "hard drive"). Although not shown, a magnetic disk drive for reading from and writing to a removable, non-volatile magnetic disk (e.g., a "floppy disk") and an optical disk drive for reading from or writing to a removable, non-volatile optical disk, such as a CD-ROM, DVD-ROM or other optical media can be provided. In such instances, each can be connected to bus 416 by one or more data media interfaces. As will be further depicted and described below, memory 424 may include at least one computer program product having a set (e.g., at least one) of program modules that are configured to carry out the functions of embodiments of the invention.

Program/utility 432, having one or more sets of program modules 434, may be stored in memory 424 by way of example and not limitation, as well as an operating system, one or more application programs, other program modules and program data. Each of the operating systems, one or more application programs, other program modules and program data or some combination thereof, may include an implementation of a networking environment. Program modules 434 generally carry out the functions and/or methodologies of embodiments of the invention as described herein. Computer system 410 may also communicate with one or more external device(s) 412, such as a keyboard, a pointing device, a display 422, etc. or one or more devices that enable a user to interact with computer system 410 and any devices (e.g., network card, modem, etc.) that enable computer system 410 to communicate with one or more other computing devices. Such communication can occur via Input/Output (I/O) interface(s) 420. Still yet, computer system 410 can communicate with one or more networks, such as a local area network (LAN), a general wide area network (WAN) and/or a public network (e.g., the Internet) via network adapter 418. As depicted, network adapter 418 communicates with the other components of computer system 410 via bus 416. It should be understood that although not shown, other hardware and software components, such as microcode, device drivers, redundant processing units, external disk drive arrays, RAID systems, tape drives and data archival storage systems may be used in conjunction with computer system 310.

The present invention may be a system, a method and/or a computer program product. The computer program product may include a computer readable storage medium (or media) having computer readable program instructions thereon for causing a processor to carry out aspects of the present invention.

The computer readable storage medium can be a tangible device that can retain and store instructions for use by an instruction execution device. The computer readable storage medium may be, for example, but is not limited to, an electronic storage device, a magnetic storage device, an optical storage device, an electromagnetic storage device, a semiconductor storage device or any suitable combination of the foregoing. A non-exhaustive list of more specific examples of the computer readable storage medium includes the following: a portable computer diskette, a hard disk, a random access memory (RAM), a read-only memory (ROM), an erasable programmable read-only memory (EPROM or Flash memory), a static random access memory (SRAM), a portable compact disc read-only memory (CD- ROM), a digital versatile disk (DVD), a memory stick, a floppy disk, a mechanically encoded device such as punchcards or raised structures in a groove having instructions recorded thereon and any suitable combination of the foregoing. A computer readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable) or electrical signals transmitted through a wire.

Computer readable program instructions described herein can be downloaded to respective computing/processing devices from a computer readable storage medium or to an external computer or external storage device via a network, for example, the Internet, a local area network, a wide area network and/or a wireless network. The network may comprise copper transmission cables, optical transmission fibers, wireless transmission, routers, firewalls, switches, gateway computers and/or edge servers. A network adapter card or network interface in each computing/processing device receives computer readable program instructions from the network and forwards the computer readable program instructions for storage in a computer readable storage medium within the respective computing/processing device.

Computer readable program instructions for carrying out operations of the present invention may be assembler instructions, instruction-set-architecture (ISA) instructions, machine instructions, machine dependent instructions, microcode, firmware instructions, state-setting data or either source code or object code written in any combination of one or more programming languages, including an object oriented programming language such as Smalltalk, C++ or the like, and conventional procedural programming languages, such as the "C" programming language or similar programming languages. The computer readable program instructions may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider). In some embodiments, electronic circuitry including, for example, programmable logic circuitry, field-programmable gate arrays (FPGA), or programmable logic arrays (PLA) may execute the computer readable program instructions by utilizing state information of the computer readable program instructions to personalize the electronic circuitry, in order to perform aspects of the present invention.

Aspects of the present invention are described herein with reference to flowchart illustrations and/or block diagrams of methods, apparatus (systems) and computer program products according to embodiments of the invention. It will be understood that each block of the flowchart illustrations and/or block diagrams and combinations of blocks in the flowchart illustrations and/or block diagrams, can be implemented by computer readable program instructions.

These computer readable program instructions may be provided to a processor of a general purpose computer, a special purpose computer or other programmable data processing apparatus to produce a machine, such that the instructions, which execute via the processor of the computer or other programmable data processing apparatus, create means for implementing the functions/acts specified in the flowchart and/or block diagram block or blocks. These computer readable program instructions may also be stored in a computer readable storage medium that can direct a computer, a programmable data processing apparatus and/or other devices to function in a particular manner, such that the computer readable storage medium having instructions stored therein comprises an article of manufacture including instructions which implement aspects of the function/act specified in the flowchart and/or block diagram block or blocks.

The computer readable program instructions may also be loaded onto a computer, other programmable data processing apparatus or other device to cause a series of operational steps to be performed on the computer, other programmable apparatus or other device to produce a computer implemented process, such that the instructions which execute on the computer, other programmable apparatus or other device implement the functions/acts specified in the flowchart and/or block diagram block or blocks.

The flowchart and block diagrams in the Figures illustrate the architecture, functionality, and operation of possible implementations of systems, methods and computer program products according to various embodiments of the present invention. In this regard, each block in the flowchart or block diagrams may represent a module, segment, or portion of instructions, which comprises one or more executable instructions for implementing the specified logical function(s). In some alternative implementations, the functions noted in the block may occur out of the order noted in the Figures. For example, two blocks shown in succession may, in fact, be executed substantially concurrently, or the blocks may sometimes be executed in the reverse order, depending upon the functionality involved. It will also be noted that each block of the block diagrams and/or flowchart illustration and combinations of blocks in the block diagrams and/or flowchart illustration, can be implemented by special purpose hardware-based systems that perform the specified functions or acts or carry out combinations of special purpose hardware and computer instructions.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the invention. The terminology used herein was chosen to best explain the principles of the embodiment, the practical application or technical improvement over technologies found in the marketplace or to enable others of ordinary skill in the art to understand the embodiments disclosed herein.

The terminology used herein is for the purpose of describing particular embodiments only and is not intended to be limiting of the invention. It should be appreciated that any particular nomenclature herein is used merely for convenience and thus, the invention should not be limited to use solely in any specific function identified and/or implied by such nomenclature. Furthermore, as used herein, the singular forms of "a", "an", and "the" are intended to include the plural forms as well, unless the context clearly indicates otherwise.

What is claimed is:

1. A method for mobile thermal load balancing in a data center, the method comprising:

determining, by one or more computer processors, a heat signature pattern for one or more data center units based on a plurality of heat signatures over a pre-determined time period;

determining, by the one or more computer processors, a high heat signature zone within a confined region of the data center based, at least in part, on a current arrangement of the one or more data center units, wherein determining the high heat signature zone includes utilizing one or more thermal cameras and computer vision to monitor the heat signature pattern for one or more data center units for a deviation from a normal heat distribution for the data center; and responsive to a determination that the high heat signature zone within the data center exceeds a pre-determined heat threshold, rearranging, by the one or more computer processors, the one or more data center units within the high heat signature zone to a region within the data center that balances a thermal load associated with the high heat signature zone across the data center.

2. The method of claim 1, further comprising:

communicating, by the one or more computer processors, with the one or more thermal cameras in a vicinity of the one or more data center units; and retrieving, by the one or more computer processors, the plurality of heat signatures for the one or more data center units from a video frame output of the one or more thermal cameras.

3. The method of claim 1, wherein determining the heat signature pattern for the one or more data center units further comprises:

analyzing, by the one or more computer processors, temporal data for heat signature fluctuations of the one or more data center units and latitudinal and longitudinal coordinates for the one or more data center units in a vectored form utilizing a regional convolutional neural network to predict probabilistic heat signatures and patterns.

4. The method of claim 1, wherein determining the high heat signature zone further comprises:

predicting, by the one or more computer processors, a workload demand that impacts the plurality of heat signatures for the one or more data center units; and retrieving, by the one or more computer processors, a heat signature from each of the one or more data center units, utilizing a screen capture from the one or more thermal cameras, that deviates from a standard heat response expected for the one or more data center units given a specific situation.

5. The method of claim 1, further comprising:

determining, by the one or more computer processors, the high heat signature zone exceeds the pre-determined heat threshold where the plurality of heat signatures for the one or more data centers units within the high heat signature zone deviate above one or more expected heat signatures for the one or more data center units, wherein the pre-determined heat threshold is based on a machine learning system that considers server rack failure and server rack fault tolerances occurring at certain high temperatures.

6. The method of claim 1, wherein rearranging the one or more data center units further comprises:

determining, by the one or more computer processors, an optimal rearrangement of the one or more data center units within the data center utilizing crowd-sourced data to provide overall thermal cooling within the data center;

selecting, by the one or more computer processors, the region within the data center to provide a desired cooling effect on the one or more data center units; and triggering, by the one or more computer processors, a mobile module to rearrange the one or more data center units within the high heat signature zone to the selected region within the data center.

7. The method of claim 6, wherein selecting the region within the data center further comprises:

creating, by the one or more computer processors, a corpus of knowledge by correlating an air flow direction within the data center, a temperature of air within the data center, a relative position of the one or more data center units generating heat, and an amount of heat generated by the one or more data center units; and predicting, by the one or more computer processors, a relative position for the one or more data center units within the data center based, at least in part, on the created corpus of knowledge, that provides the desired cooling effect and thermal load balancing.

8. A computer program product mobile thermal load balancing in a data center, the computer program product comprising:

one or more computer readable storage media and program instructions stored on the one or more computer readable storage media, the program instructions comprising:

program instructions to determine a heat signature pattern for one or more data center units based on a plurality of heat signatures over a pre-determined time period;

program instructions to determine a high heat signature zone within a confined region of the data center based, at least in part, on a current arrangement of the one or more data center units, wherein determining the high heat signature zone includes utilizing one or more thermal cameras and computer vision to monitor the heat signature pattern for one or more data center units for a deviation from a normal heat distribution for the data center; and responsive to a determination that the high heat signature zone within the data center exceeds a pre-determined heat threshold, program instructions to rearrange the one or more data center units within the high heat signature zone to a region within the data center that balances a thermal load associated with the high heat signature zone across the data center.

9. The computer program product of claim 8, further comprising:

program instructions to communicate with the one or more thermal cameras in a vicinity of the one or more data center units; and program instructions to retrieve the plurality of heat signatures for the one or more data center units from a video frame output of the one or more thermal cameras.

10. The computer program product of claim 8, wherein program instructions to determine the heat signature pattern for the one or more data center units further comprise:

program instructions to analyze temporal data for heat signature fluctuations of the one or more data center units and latitudinal and longitudinal coordinates for the one or more data center units in a vectored form utilizing a regional convolutional neural network to predict probabilistic heat signatures and patterns.

11. The computer program product of claim 8, wherein program instructions to determine the high heat signature zone further comprise:

program instructions to predict a workload demand that impacts the plurality of heat signatures for the one or more data center units; and program instructions to retrieve a heat signature from each of the one or more data center units, utilizing a screen capture from the one or more thermal cameras, that deviates from a standard heat response expected for the one or more data center units given a specific situation.

12. The computer program product of claim 8, further comprising:

program instructions to determine the high heat signature zone exceeds the pre-determined heat threshold where the plurality of heat signatures for the one or more data centers units within the high heat signature zone deviate above one or more expected heat signatures for the one or more data center units, wherein the pre-determined heat threshold is based on a machine learning system that considers server rack failure and server rack fault tolerances occurring at certain high temperatures.

13. The computer program product of claim 8, wherein program instructions to rearrange the one or more data center units further comprise:

program instructions to determine an optimal rearrangement of the one or more data center units within the data center utilizing crowd-sourced data to provide overall thermal cooling within the data center;

program instructions to select the region within the data center to provide a desired cooling effect on the one or more data center units; and program instructions to trigger a mobile module to rearrange the one or more data center units within the high heat signature zone to the selected region within the data center.

14. The computer program product of claim 13, wherein program instructions to select the region within the data center further comprise:

program instructions to create a corpus of knowledge by correlating an air flow direction within the data center, a temperature of air within the data center, a relative position of the one or more data center units generating heat, and an amount of heat generated by the one or more data center units; and program instructions to predict a relative position for the one or more data center units within the data center based, at least in part, on the created corpus of knowledge, that provides the desired cooling effect and thermal load balancing.

15. A computer system for mobile thermal load balancing in a data center, the computer system comprising:

one or more computer processors;
one or more computer readable storage media; and
program instructions stored on at least one of the one or more computer readable storage media for execution by at least one of the one or more computer processors, the program instructions comprising:

program instructions to determine a heat signature pattern for one or more data center units based on a plurality of heat signatures over a pre-determined time period;

program instructions to determine a high heat signature zone within a confined region of the data center based, at least in part, on a current arrangement of the one or more data center units, wherein determining the high heat signature zone includes utilizing one or more thermal cameras and computer vision to monitor the heat signature pattern for one or more data center units for a deviation from a normal heat distribution for the data center; and responsive to a determination that the high heat signature zone within the data center exceeds a pre-determined heat threshold, program instructions to rearrange the one or more data center units within the high heat signature zone to a region within the data center that balances a thermal load associated with the high heat signature zone across the data center.

16. The computer system of claim 15, further comprising:

program instructions to communicate with the one or more thermal cameras in a vicinity of the one or more data center units; and program instructions to retrieve the plurality of heat signatures for the one or more data center units from a video frame output of the one or more thermal cameras.

17. The computer system of claim 15, wherein program instructions to determine the heat signature pattern for the one or more data center units further comprise:

program instructions to analyze temporal data for heat signature fluctuations of the one or more data center units and latitudinal and longitudinal coordinates for the one or more data center units in a vectored form utilizing a regional convolutional neural network to predict probabilistic heat signatures and patterns.

18. The computer system of claim 15, wherein program instructions to determine the high heat signature zone further comprise:

program instructions to predict a workload demand that impacts the plurality of heat signatures for the one or more data center units; and program instructions to retrieve a heat signature from each of the one or more data center units, utilizing a screen capture from the one or more thermal cameras, that deviates from a standard heat response expected for the one or more data center units given a specific situation.

19. The computer system of claim 15, wherein program instructions to rearrange the one or more data center units further comprise:

program instructions to determine an optimal rearrangement of the one or more data center units within the data center utilizing crowd-sourced data to provide overall thermal cooling within the data center;

program instructions to select the region within the data center to provide a desired cooling effect on the one or more data center units; and program instructions to trigger a mobile module to rearrange the one or more data center units within the high heat signature zone to the selected region within the data center.

20. The computer system of claim 19, wherein program instructions to select the region within the data center further comprise:

program instructions to create a corpus of knowledge by correlating an air flow direction within the data center, a temperature of air within the data center, a relative position of the one or more data center units generating heat, and an amount of heat generated by the one or more data center units; and program instructions to predict a relative position for the one or more data center units within the data center based, at least in part, on the created corpus of knowledge, that provides the desired cooling effect and thermal load balancing.

* * * * *